United States Patent [19]

Suzuki et al.

[11] Patent Number: 4,707,654
[45] Date of Patent: Nov. 17, 1987

[54] INTEGRATED CIRCUIT HAVING INPUT AND OUTPUT TERMINALS FOR TESTING

[75] Inventors: Toshiro Suzuki, Tama; Fumiaki Fujii, Nishitama; Izuru Yamada, Yokohama, all of Japan

[73] Assignee: Hitachi, Ltd., Tokyo, Japan

[21] Appl. No.: 773,302

[22] Filed: Sep. 6, 1985

[30] Foreign Application Priority Data

Sep. 14, 1984 [JP] Japan .................. 59-191551

[51] Int. Cl.$^4$ ............................................ C01R 31/28
[52] U.S. Cl. ................................. 324/158 R; 324/73 R
[58] Field of Search ............ 324/73 R, 158 R, 123 R, 324/73 P C; 330/110, 250, 307; 361/91

[56] References Cited

U.S. PATENT DOCUMENTS

| | | | |
|---|---|---|---|
| 3,183,446 | 5/1965 | Richman | 324/110 |
| 3,363,177 | 1/1968 | Houghton | 324/123 R |
| 3,590,340 | 6/1971 | Kubo et al. | 307/304 |
| 4,025,871 | 5/1977 | Peil | 330/307 |

Primary Examiner—Ernest F. Karlson
Assistant Examiner—Vinh P. Nguyen
Attorney, Agent, or Firm—Antonelli, Terry & Wands

[57] ABSTRACT

An integrated circuit is constructed in order that tests can be conducted on a plurality of circuits to determine which of the circuits is defective. In particular, the circuit is constructed to allow such testing with the use of fewer input and output pins for testing. To accomplish this, a first buffer gate circuit, a resistor, and a second buffer gate are connected in series in the order mentioned between the output terminal of a first circuit and the input terminal of a second circuit. An input and output terminal pin for testing is located at a junction point of the resistor and second buffer gate.

4 Claims, 5 Drawing Figures

INTEGRATED CIRCUIT HAVING INPUT AND OUTPUT TERMINALS FOR TESTING

BACKGROUND OF THE INVENTION

1. Field of the Invention

The present invention relates to an integrated circuit having a testing terminal, and more particularly to a structure of an integrated circuit formed of MOS transistors and having a terminal for inputting and outputting a test signal for a performance test thereof.

2. Description of the Prior Art

A semiconductor integrated circuit containing complex functional circuits, namely, a large-scale integrated circuit (LSI) which is formed in a LSI chip, requires a large number of input and output pins for making tests of individual circuits in the LSI.

In order to decrease the number of the input and output pins for testing, an integrated circuit provided therein with a register for testing to store testing data is known and disclosed in Japanese Patent Publication No. 52-29897.

With such an integrated circuit having the testing register, while it has been possible to test one section of the integrated circuit at one time of testing, a real-time test for the entire circuit has been difficult. Further, since the integrated circuit to be tested has to be divided into sections for the sake of simplification of test sequence and identification of a trouble mode, when it becomes necessary to provide a continuous analog waveform for the integrated circuit as its own essential input and output signal, it has become difficult to synchronize the analog waveform with other digital test data to be simultaneously applied to other section, and so such a test has been impossible.

SUMMARY OF THE INVENTION

A primary object of the present invention is to provide an integrated circuit which needs fewer test terminals but enables an overall real-time test without lessening the merit of divisional tests for the simplification of the test sequence of the integrated circuit and the identification of a trouble mode.

To be more specific, a primary object of the invention is the provision of an integrated circuit having a common input/output circuit capable of using a terminal both as an input terminal for testing and an output terminal for testing without the need for any switchover circuit.

To achieve the foregoing object, the present invention has arranged, in an integrated circuit which includes at least two circuits that are to be functionally connected in series, to insert a series circuit including a first gate resistor and a second buffer gate connected in series between the output terminal of one of the above mentioned two circuits and the input terminal of the other circuit connected therewith and provide a single pin as a testing terminal disposed at a junction point of the resistor element and the second buffer.

According to the integrated circuit of the present invention, when individual tests are made on two circuits, essentially the same effect that one circuit is cut off from the other is attained without artificially disconnecting or connecting terminals, and so the number of testing pins has been decreased to half. Specifically, when a plurality of sets of two circuits in such relationship as mentioned above are to be included in an integrated circuit, the capability of reducing the number of input and output pins for testing considerably contributes to materialization of the integrated circuit.

The above mentioned and other features and objects of this invention will become more apparent by reference to the following description taken in conjunction with the accompanying drawings.

DESCRIPTION OF THE PREFERRED EMBODIMENT

Figure 1:
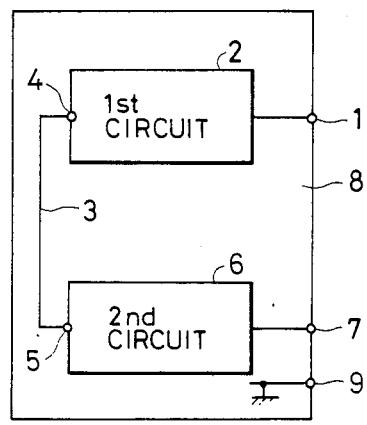
FIGS. 1 and 2 are drawings showing structure of a general integrated circuit.

FIG. 1 is a drawing showing an example of a simple integrated circuit to which the present invention is applicable, in which a plurality of circuits, a first circuit 2 and a second circuit 6, for example, are formed on an integrated circuit chip 8. In FIG. 1 is shown the case where only two circuits are included for the sake of simplicity of explanation, but the chip can include two or more independent sets of circuits, or the input and output terminals of the above first and second circuits, for example, the output terminal 4 of the first circuit and the input terminal 5 of the second circuit, can be connected with inputs to or outputs from one or more other circuits. Although it is now shown in the drawing for the sake of simplicity of explanation, there is normally provided a grounding terminal 9 connected in common to each circuit.

Figure 2:
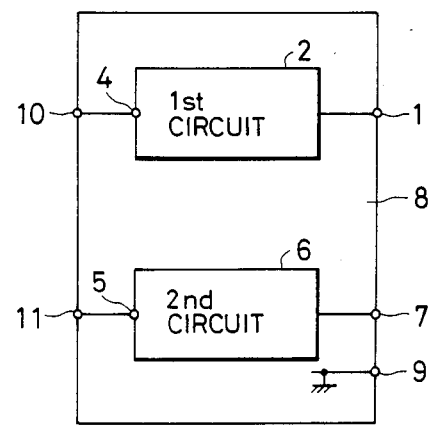

In the circuit in FIG. 1, various types of circuits are conceivable for the last first circuit 2 and the second circuit 6. For example, such a case is conceivable where an analog signal is applied to the input terminal 1, the first circuit 2 is an A/D converter, and the second circuit 6 is a circuit for processing the converted digital signal. In such a case, a complex digital signal corresponding to the input analog signal will be output from the output terminal 4. On the other hand, another digital signal processed from the above mentioned complex digital signal will be output from the output terminal 7. Therefore, in the event that a desired characteristic was not obtained while the signal from the output terminal 7 is observed with a predetermined testing analog signal, such as a known d.c. signal or an analog signal of specific amplitude and frequency, applied to the input terminal 1, then it would often be difficult to judge which of the circuits 2 and 6 is faulty. If the second circuit 6 is a pure digital circuit, the check will be quickly carried out with a simple and easy test pattern or the like, but the circuit 2 including both analog and digital circuits must be checked by a special testing method, and simultaneous checking of both the circuits will thus often be difficult. Therefore, not only does it become necessary to cut off the connection wire 3 and provide two terminal pins 10 and 11 for testing, as shown in FIG. 2, but also the two terminals must be externally shorted at the time of normal use. Inconvenience in the use is thus invited by the requirement for two testing terminal to be disposed on the semiconductor chip.

Figure 3:
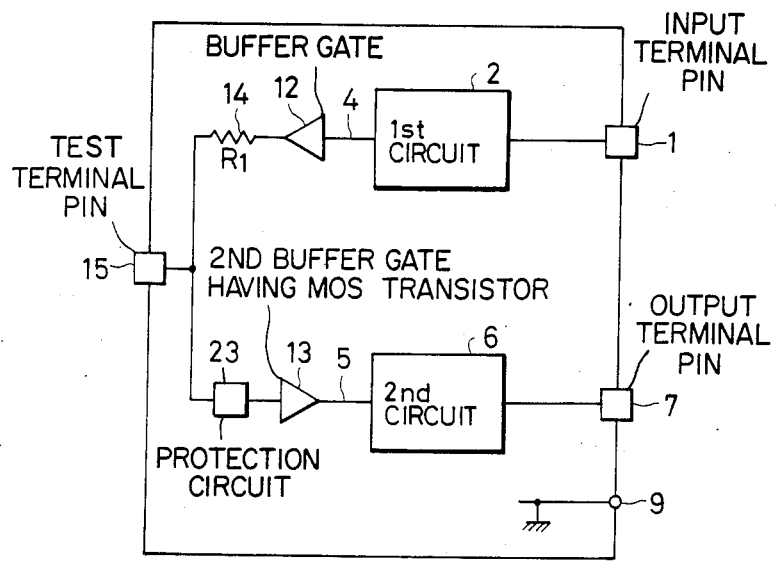
FIG. 3 is a drawing showing a preferred embodiment of the integrated circuit of the present invention.

FIG. 3 is a drawing showing structure of an integrated circuit chip of a preferred embodiment of the present invention.

In the embodiment, buffer gates 12 and 13 and a resistor 14 whose resistance value is R1 are connected in series between the output terminal 4 of the first circuit 2 and the input terminal 5 of the second circuit 6, and only a single testing terminal 15 is provided between the resistor 14 and the input terminal of the buffer gate 13.

The testing terminal 15 is not connected with any other circuitry during the normal operation of the integrated circuit, that is, while the first circuit 2 and the second circuit 6 perform their own functions. Also, the test terminal is not connected to any other circuitry when a testing signal is applied to the input terminal 1 of the first circuit and the signal from the output terminal 7 is checked.

The buffer 13 shown in FIG. 3 is generally structured by a MOS circuit because its input impedance can then be made extremely high and the signal output from the output terminal 4 can be input to the input terminal 5 sufficiently free of error even if the resistance of the resistor 14 is made high to some extent. And, if the external testing terminal 15 is grounded, then the input to the buffer 13 is kept at a low level and the first circuit 2 and the second circuit 6 can thus be electrically separated. Though at this time the output of the buffer gate 12 is grounded through the resistor 14, an ordinary type of the output buffer circuit can satisfactorily function by making the resistance R1 higher to some extent.

By the described arrangement, it is enabled to externally control the connection between the circuits 2 and 6 at will either by keeping open or grounding the terminal 15. In view of the above free controllability of the connection between the circuits 2 and 6, the following three kinds of tests have been made possible:

(1) monitoring of an output signal from the terminal 4 with the circuits 2 and 6 put in a connected condition;

(2) monitoring of an output signal from the terminal 4 with the circuits 2 and 6 put in a disconnected condition; and (3) inputting any desired test signal to the terminal 5 with the circuits 2 and 6 put in a disconnected condition.

Figure 4:
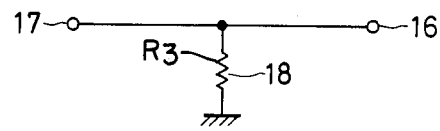
FIGS. 4 and 5 are drawings showing external impedance circuits to be employed in the tests of the integrated circuit of the invention.

In carrying out the above test (1), a terminal 16 of a circuit as shown in FIG. 4 is connected to the terminal 15 in FIG. 3, and the resistance R3 of the grounding resistor 18 is made sufficiently high in comparison with R1 indicated by 14 in FIG. 3, or an observing apparatus having a sufficiently high internal impedance, such as an oscilloscope, is connected to the terminal 17 with the resistor 18 taken away.

In carrying out the above test (2), the resistance R3 of the resistor 18 is made very low in comparison with R1 with the connection kept the same as in the case (1) above. At this time, the voltage of logic "1" appearing at the terminal 15 will be lowered from the original magnitude Vdd to $$Vdd \times \{R3/(R1+R3)\} = Vdd' \quad (1)$$

As long as the voltage magnitude Vdd' is lower than the logical threshold voltage of the buffer gate 13, the output from the first circuit 2 is not transmitted to the circuit 6. On the other hand, logical outputs corresponding to the outputs from the circuit 2 appear at the terminal 15 even if its logical level is lowered by being compressed according to the equation (1) above. Therefore, settings for the test (2) are provided by connecting a circuit whose logical threshold voltage is a half of Vdd' in the equation (1) to the terminal 17 in FIG. 4.

Incidentally, it is naturally preferable that the value of R3/(R1+R3) in the equation (1) is made less than ½.

Figure 5:
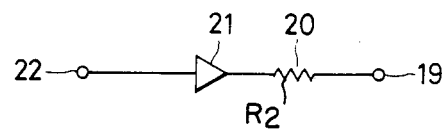

To perform the test (3), a circuit as shown in FIG. 5 is used. Here, the resistance R2 of the resistor 20 is made to be sufficiently low in comparison with the resistance R1 similarly to the resistance R3 of the resistor 18 in the above test (2). Thus, by connecting the terminal 19 to the testing terminal 15 in FIG. 3, the circuit 2 is electrically separated from the circuit 6. (It is assumed that the output impedance of the buffer circuit 21 is sufficiently low.) If a certain logical signal is applied to the input terminal 22 shown in FIG. 5 under these conditions, the output therefrom is applied to the buffer 13 through the terminal 15 of FIG. 3 to drive the circuit 6.

By the present invention as described so far, connection and disconnection between two blocks within an integrated circuit, signal monitoring, and application of an external signal are made possible, and decrease in number of circuit test pins and simplification of testing have been made attainable.

Now it is necessary to provide the buffer 13 shown in FIG. 3 with an input protection circuit as in cases of other ordinary MOS input circuits. The input protection circuit is generally formed of a resistor of several kiloohms inserted in the input signal line in series therewith and a p-n junction diode connected across the above resistor reversely biased to the power source. Referring to FIG. 3, the input protection circuit can be inserted between the input side of the buffer 13 and the terminal 15, i.e., at the point indicated by 23 in the drawing, and then the input protection is attained without reducing the effect of the present invention.

The signal output from the first circuit 2 in FIG. 3 is not necessarily a pure digital signal; even if it is an analog signal, the effect of the present invention is obtainable.

As described so far, by implementation of the present invention, the following three functions are provided by an integrated circuit in which only a single external pin is used: (1) monitoring of a signal; (2) monitoring a signal with signal lines disconnected; and (3) input of any external signal with a signal line disconnected. And thus considerable effect is produced in simplification of evalation and checking of LSI's.

What is claimed is:

1. An integrated circuit comprising:
   at least a first circuit and a second circuit to be connected in series;
   a first buffer gate, a resistor, and a second buffer gate connected between an output terminal of said first circuit and an input terminal of said second circuit in the order mentioned; and
   means for allowing testing of the output of the first circuit and for allowing the application of an input test signal to said second circuit without said input test signal having to pass through said first circuit, said means comprising an input/output terminal pin for test signals provided at a junction point of said resistor and said second buffer gate.

2. An integrated circuit according to claim 1, wherein said first circuit is an analog/digital converting circuit and said second circuit is a digital/digital converting circuit.

3. An integrated circuit according to claim 1, wherein said second buffer gate is comprised of MOS transistors, and wherein an input protection circuit is connected between said resistor and an input terminal of said second buffer gate to protect said MOS transistors of said second buffer gate.

4. An integrated circuit according to claim 1, wherein said integrated circuit is formed in a chip.

* * * * *